(12) United States Patent
Mouli

(10) Patent No.: US 7,605,028 B2
(45) Date of Patent: Oct. 20, 2009

(54) METHOD OF FORMING A MEMORY DEVICE HAVING A STORAGE TRANSISTOR

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 489 days.

(21) Appl. No.: 11/042,207

(22) Filed: Jan. 26, 2005

(65) Prior Publication Data

US 2005/0128787 A1 Jun. 16, 2005

Related U.S. Application Data

(62) Division of application No. 10/680,158, filed on Oct. 8, 2003, now abandoned.

(51) Int. Cl.
*H01L 21/84* (2006.01)

(52) U.S. Cl. ............... 438/157; 257/E21.32; 438/162; 438/164; 438/266; 438/294

(58) Field of Classification Search .......... 438/481, 438/151, 157, 162, 164, 286, 294; 257/E21.32
See application file for complete search history.

(56) References Cited

U.S. PATENT DOCUMENTS

| | | | |
|---|---|---|---|
| 5,307,305 A | 4/1994 | Takasu | |
| 5,448,513 A | 9/1995 | Hu et al. | |
| 5,523,243 A * | 6/1996 | Mohammad | 438/312 |
| 6,221,724 B1 | 4/2001 | Yu et al. | |
| 6,313,486 B1 | 11/2001 | Kencke et al. | |
| 6,368,947 B1 * | 4/2002 | Yu | 438/530 |
| 6,537,891 B1 | 3/2003 | Dennison et al. | |
| 6,720,619 B1 * | 4/2004 | Chen et al. | 257/347 |
| 6,806,537 B2 | 10/2004 | Matsumoto et al. | |
| 6,838,322 B2 | 1/2005 | Pham et al. | |
| 6,861,689 B2 * | 3/2005 | Burnett | 257/296 |
| 6,924,181 B2 | 8/2005 | Huang et al. | |
| 2002/0113294 A1 | 8/2002 | Rhee et al. | |
| 2002/0115240 A1 * | 8/2002 | Assaderaghi et al. | 438/149 |
| 2002/0125536 A1 | 9/2002 | Iwasa | |
| 2003/0113970 A1 * | 6/2003 | Fried et al. | 438/286 |
| 2003/0168680 A1 * | 9/2003 | Hsu | 257/296 |
| 2004/0036126 A1 * | 2/2004 | Chau et al. | 257/401 |
| 2005/0017240 A1 * | 1/2005 | Fazan | 257/59 |
| 2005/0062088 A1 | 3/2005 | Houston | |

OTHER PUBLICATIONS

Okhonin et al., A Capacitor-Less 1T-DRAM Cell, IEEE Electron Device Lett., vol. 23, No. 2, p. 85-87.*

(Continued)

*Primary Examiner*—Anh Phung
*Assistant Examiner*—Michael Lulis
(74) *Attorney, Agent, or Firm*—Dickstein Shapiro LLP

(57) ABSTRACT

A memory device and a method of forming the memory device. The memory device comprises a storage transistor at a surface of a substrate comprising a body portion between first and second source/drain regions, wherein the source/drain regions are regions of a first conductivity type. The storage transistor also comprises a gate structure that wraps at least partially around the body portion in at least two spatial planes. A bit line is connected to the first source/drain region and a word line connected to the gate structure. The memory device does not require an additional capacitive storage element.

39 Claims, 11 Drawing Sheets

OTHER PUBLICATIONS

Wang et al., Sub-40 nm PtSi Schottky source/drain metal-oxide-semiconductor field-effect transistors, App. Phys. Lett., vol. 74, p. 1174-1176.*

Alain Chun-Keung Chan et al.—"Effects of Floating Body on Double Polysilicon Partially Depleted SOI Nonvolatile Memory Cell," IEEE Electron Device Letters, 2003, pp. 1-3.

P. Fazan et al.—"Capacitor-Less 1-Transistor DRAM," IEEE International SOI Conference, Oct. 2002, pp. 10-13.

Kazumi Inoh et al.—"FBC (Floating Body Cell) for Embedded DRAM on SOI," 2003 Symposium on VLSI Technology Digest of Technical Papers, Jun. 2003, 2 pages.

Jean-Michel Sallese et al.—"Principles of the 1-T DRAM Concept on SOI," MIXDES 02, 19 pages.

Takashi Ohsawa, et al.—"Memory Design Using a One-Transistor Gain Cell on SOI," IEEE Journal of Solid-State Circuits, vol. 37, No. 11, Nov. 2002.

* cited by examiner

METHOD OF FORMING A MEMORY DEVICE HAVING A STORAGE TRANSISTOR

CROSS-REFERENCE TO RELATED APPLICATION

The present application is divisional application of U.S. patent application Ser. No. 10/680,158, filed on Oct. 8, 2003, now abandoned the disclosure of which is incorporated herein by reference in its entirety.

FIELD OF THE INVENTION

The present invention relates to memory devices, more specifically to a dynamic random access memory device including a field effect transistor storage device.

BACKGROUND OF THE INVENTION

Semiconductor memory, such as a random access memory (RAM), is an essential semiconductor device. A RAM device allows the user to execute both read and write operations on its memory cells. DRAM is a specific category of RAM containing an array of individual memory cells. DRAM devices are the most cost effective high speed memory used with computers and computer systems. Typically, each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 100. Each cell 100 contains a storage capacitor 104 and an access field effect transistor (FET) 102. For each cell, one side of the storage capacitor 104 is connected to a reference voltage (illustrated as a ground potential for convenience purposes). The other side of the storage capacitor 104 is connected to the drain of the transfer device 102. The gate of the transfer device 102 is connected to a line known in the art as a word line 108. The source of the transfer device 102 is connected to a line known in the art as a bit line 106 (also known in the art as a digit line). With the memory cell 100 components connected in this manner, it is apparent that the word line 108 controls access to the storage capacitor 104 by allowing or preventing the signal (representing a logic "0" or a logic "1") carried on the bit line 106 to be written to or read from the storage capacitor 104. Thus, each cell 100 contains one bit of data (i.e., a "0" or "1").

As DRAM devices continue to be scaled down in size, it is difficult to provide capacitors in a small area with sufficient capacitance, typically greater than 30 femtoFarads (fF). In addition, it is difficult to provide an access transistor with good off-state leakage characteristics for refresh operations and good on-state characteristics to write into the cell. Several designs have been proposed to address these issues.

One such design is a silicon-on-insulator (SOI) based memory cell that eliminates the need for a capacitor. See K Inoh et al, "FBC (Floating Body Cell) for Embedded DRAM on SOI," 2003 *Symp. on VLSI Tech. Digest*, June 2003; P. Fazan et al., "Capacitor-less 1-T DRAM," 2002 *IEEE Int'l. SOI Conf.*, pp. 10-13, October 2002; H. Wann et al., "A Capacitorless DRAM Cell on SOI Substrate," *Tech. Diest, Int'l Electron Device Mtg.*, pp. 635-638, December 1993. The above references discuss one-transistor capacitor-less (1T/0C) DRAM cells and the operation of a DRAM circuit employing such cells. The above references are incorporated herein by reference.

Such capacitor-less cells, however, can suffer from poor performance characteristics related to retention time, access time, distribution characteristics, and reliability. In a 1T/0C DRAM cell, carriers are generated in the substrate bulk to write a "1," and are pulled out from the substrate bulk to write a "0." In a 1T/0C DRAM cell employing a planar SOI device, carrier generation can present problems. For example, when impact ionization is essential for operation of such a DRAM cell, device reliability can be poor and efficiency can be reduced at higher temperatures due to a decrease in ionization. Also, a planar device can result in limited operation speed, disturb, and write operations that consume a lot of power because the transistor must be in an on-state. Further, when the planar SOI devices are scaled to smaller sizes charge storage can be limited due to the reduced active area.

It would be advantageous to provide a storage device structure for use in a memory cell that would allow for reduced size while providing improved performance characteristics.

BRIEF SUMMARY OF THE INVENTION

Embodiments of the invention provide a memory cell and a method of forming the memory cell. The memory cell comprises a storage transistor at a surface of a substrate. The storage transistor comprises a body portion between first and second source/drain regions, wherein the source/drain regions are regions of a first conductivity type. The storage transistor also comprises a gate structure that wraps at least partially around the body portion in at least two spatial planes. A bit line is connected to the first source/drain region and a word line is connected to the gate structure.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
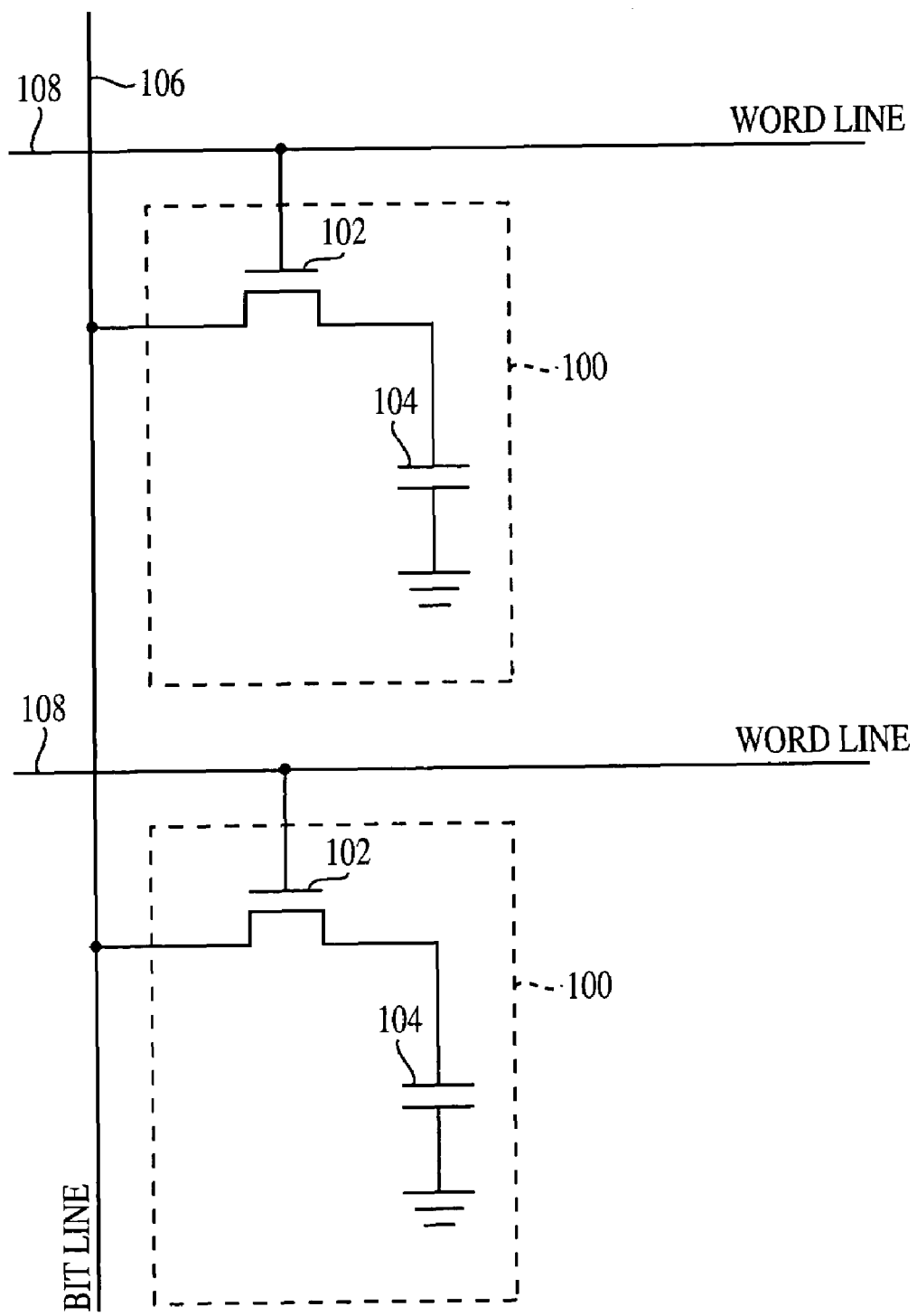
FIG. 1 is a schematic diagram of a pair of conventional DRAM cells.

In the following detailed description, reference is made to the accompanying drawings, which form a part hereof and illustrate specific embodiments in which the invention may be practiced. In the drawings, like reference numerals describe substantially similar components throughout the several views. It is noted that the drawings of the invention are not to scale. The drawings are intended to depict only exemplary embodiments of the invention and, therefore, should not be considered as limiting the scope of the invention. These embodiments are described in sufficient detail to enable those skilled in the art to practice the invention, and it is to be understood that other embodiments may be utilized, and that structural, logical, and electrical changes may be made without departing from the spirit and scope of the present invention.

The terms "wafer" and "substrate" are to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

Embodiments of the present invention provide a storage transistor having a wrapped-around gate structure for use in a memory cell, and particularly for use in a one transistor capacitor-less (1T/0C) DRAM cell. The storage transistor is configured to employ any of the following means to generate charge to be stored in the storage transistor: a) impact ionization; b) band-to-band tunneling; and c) channel-initiated secondary hot electrons (CHISEL). A combination of these three methods can be used to increase carrier generation efficiency. Carriers, e.g., holes, generated by these methods are stored in the body of the storage transistor during a write operation.

Impact ionization generates carriers when a first generation high-energy undergoes a collision (scattering event) with the lattice of the substrate. For example, a first generation high-energy electron in the conduction band undergoes a collision, thereby liberating a second generation electron from the valence band. The second generation electron leaves behind a hole. High-energy first generation carriers lose energy upon collision as energy is transferred to the second generation electron.

Impact ionization is a strong function of carrier energy. Impact ionization is strongly dependent on temperature and is aided by a high electric field, but is not dependent upon the electric field. The frequency of impact ionization decreases at higher temperatures due to increased lattice scattering. Further, impact ionization also depends strongly on the energy band structure of the substrate, which is an intrinsic material property. See V. Chandramouli et al., "Design Consideration for High Performance Avalanche Photodiode Multiplication Layers," IEEE Transactions on Electron Devices, vol. 41, pp. 648-654, 1994, which is incorporated herein by reference, discussing impact ionization.

Band-to-band tunneling of carriers occurs when there is significant band bending in the presence of electric fields in a device. Like impact ionization, band-to-band tunneling results in charge carrier amplification. There are, however, significant differences. Band-to-band tunneling is strongly dependent on electric field and is independent of temperature. In transistors, band-to-band tunneling is a primary cause of gate-induced-drain-leakage (GIDL).

CHISEL mechanisms also result in carrier amplification. As is known in the art, carrier generation through CHISEL mechanisms involve impact ionization and second generation carrier energy gain in the presence of an electric field.

According to an exemplary embodiment of the invention, a fin-type field effect transistor (FinFET) is provided for a 1T/0C DRAM cell. As is known in the art, a FinFET is a multiple-gate FET and, typically, is a fully depleted (FD) SOI device employed in advanced logic technologies. FD-FinFET's are typically designed to eliminate floating body effect (FBE). For an SOI FET, there is often no contact to the body portion between source and drain regions so that the body is floating. Floating body effect causes fluctuation in the threshold voltage for the device from charge build up in the body, which is detrimental to conventional operation of a FET.

A FD-SOI device, however, is not suited for charge storage as needed in a DRAM cell. When a FinFET is to be used as a storage device, it is advantageous to have FBE. Therefore, embodiments of the invention provide a partially depleted (PD) FinFET with increased FBE over a FD-SOI device. See D. Munteanu et al., "Generation-Recombination Transient Effects in Partially Depleted SOI Transistors: Systematic Experiments and Simulations," IEEE Transactions on Electron Devices, vol. 45, No. 8, pp. 1678-83, August 1998, describing the most frequent transient phenomena due to FBE in PD SOI MOSFET's.

Figure 2:
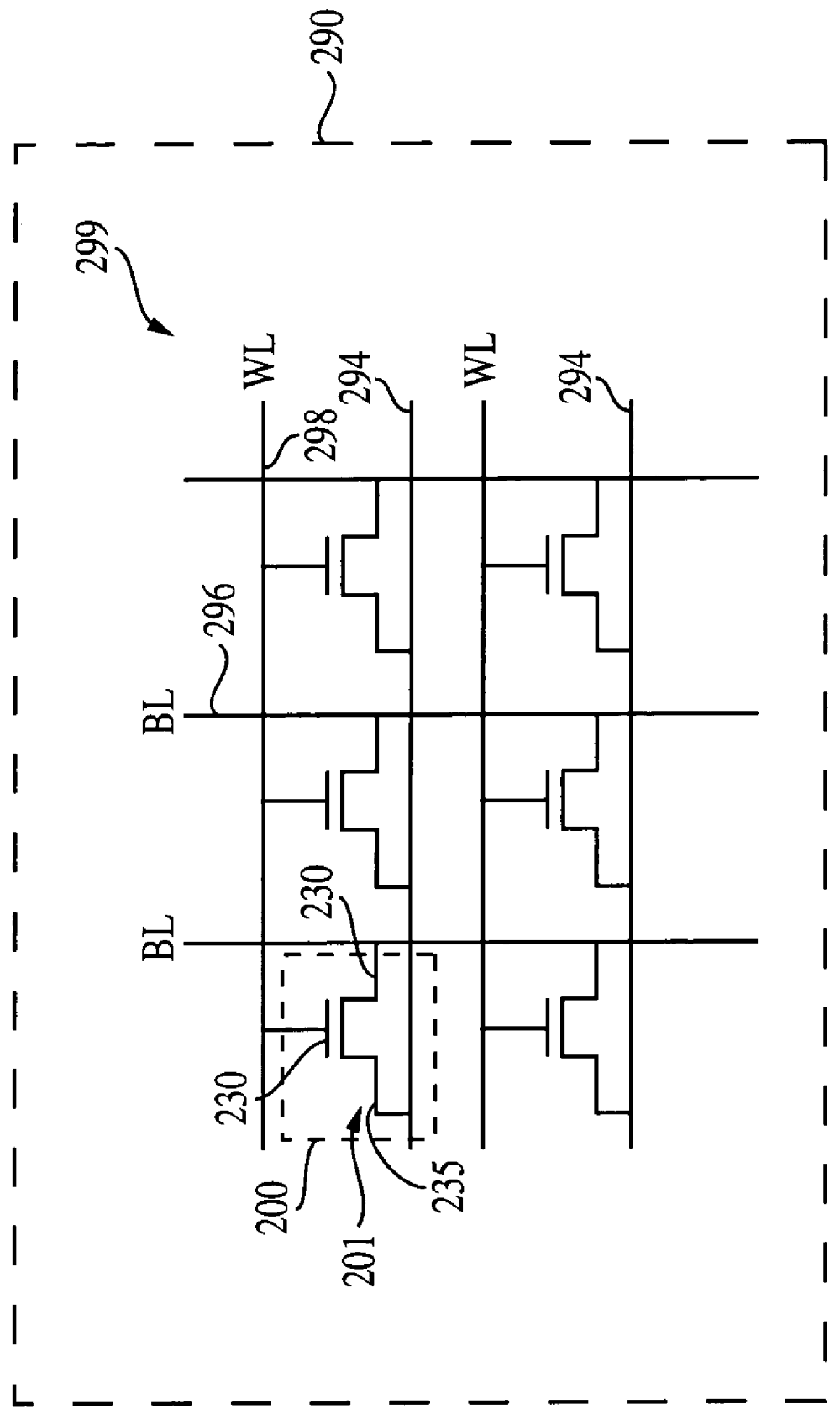
FIG. 2 is a three dimensional schematic diagram of a memory cell according to an exemplary embodiment of the invention.

FIG. 2 is a schematic diagram of a memory array 299 according to an exemplary embodiment of the invention. Memory array 299 is a DRAM memory array that includes a DRAM cell 200 described below. In the illustrated embodiment, all cells of memory array 299 are DRAM cells 200. Memory array 299 can be included on a semiconductor chip 290.

Figure 3:
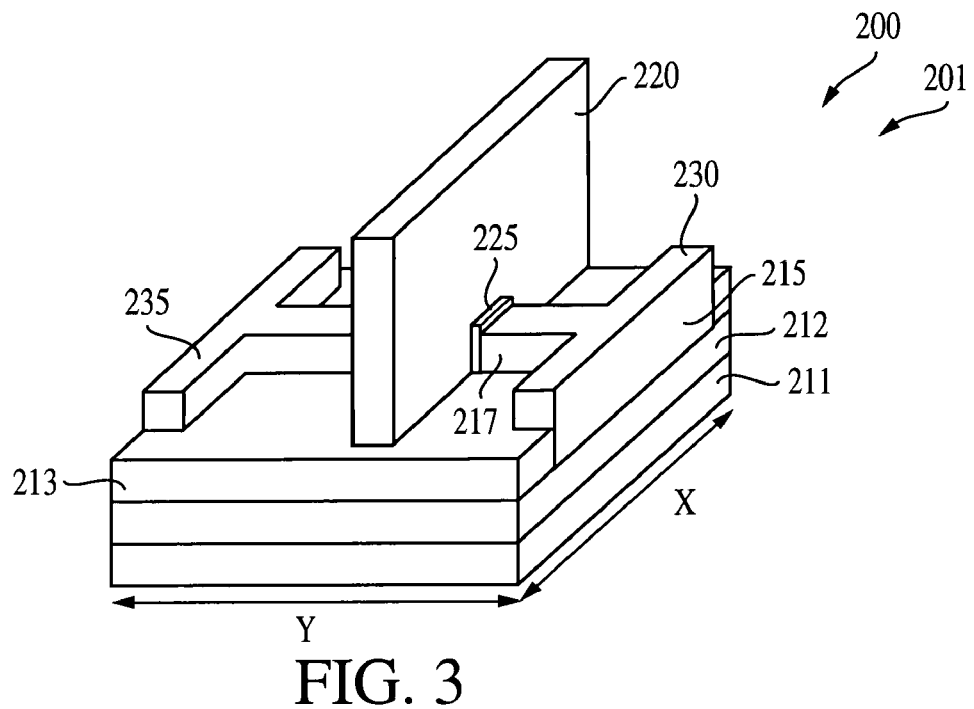
FIG. 3 is a cross sectional view of the memory cell of FIG. 2 along the X direction.

FIG. 3 is a schematic three dimensional representation of a portion of a DRAM cell 200 constructed according to an exemplary embodiment of the invention. DRAM cell 200 is a 1T/0C cell having a FinFET 201. Illustratively, FinFET 201 is an N-channel device.

FinFET 201 is a partially depleted (PD) SOI device. Accordingly, FinFET 201 is formed of a silicon layer 215 over a buried oxide layer (BOX) 212. BOX 212 overlies a base silicon layer 211. There is also an isolation region 213 for isolating FinFET 201 from neighboring devices. Illustratively, isolation region 213 is a shallow trench isolation region.

As shown in FIG. 2, a gate structure 220 of a FinFET 201 is connected to a word line 298. FinFET 201 includes a body 217 between a source/drain region 235 and a source/drain region 230. As depicted in FIG. 2, a source/drain region 230 of FinFET 201 is connected to a bit line 296 and source/drain region 235 of FinFET 201 is connected to a line 294. As FinFET 201 is an N-channel device, holes are stored in body 217 to write a "1" into cell 200 and ejected from body 217 to write a "0" into cell 200.

Figure 4:
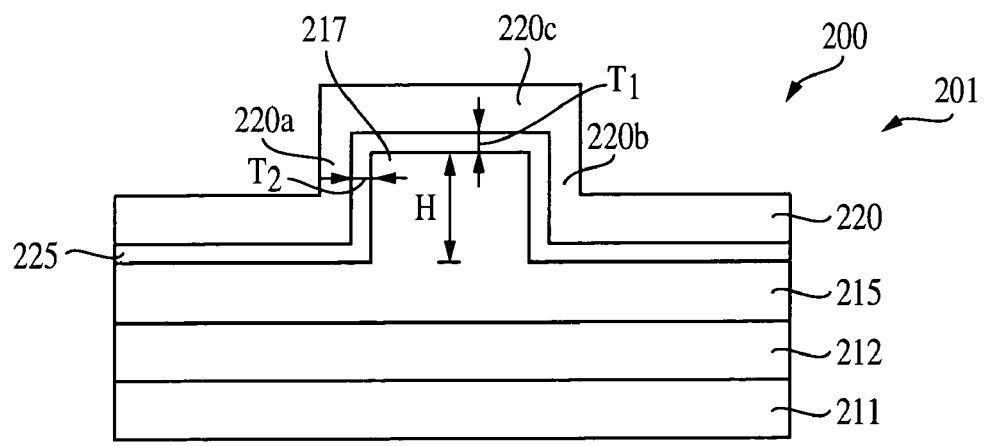
FIG. 4 is a cross sectional view of the memory cell of FIG. 2 along the Y direction.

The body 217 is a structure protruding from a surface of the substrate layer 215 and has a wall or fin-like shape. As FinFET 201 is an SOI device, body 217 is floating. There is a gate oxide layer 225 in contact with the body 217. Over the oxide layer 225 is a gate structure 220. Gate structure 220 wraps around a portion of the body 217 to form gates 220a, 220b, and 220c (FIG. 4). Gates 220a and 220b are on opposing sides of body 217, and gate 220c is on a top surface of body 217. Illustratively, gate structure 220 wraps around three sides of body 217 with gates 220a, 220b, and 220c being interconnected. There are also sidewall spacers 226 (FIG. 4) on sidewalls of gate structure 220. For simplicity, sidewall spacers 226 are not depicted in FIG. 3.

Because gate structure 220 wraps around three sides of body 217, the gates provide good control in the sub-threshold and linear operating regions. Additionally, due to superior gate control, FinFET 201 can be formed to have a low threshold voltage. FinFET 201 can have a threshold voltage between approximately 300 mV to approximately 700 mV, when no charge is stored in body 217. Illustratively, the threshold voltage of FinFET 201 is approximately 500 mV. A low threshold voltage enables low power operation, particularly where band-to-band tunneling is used to write a "1" into cell 200. Furthermore, FinFET 201 is more easily scaled to smaller physical dimensions and lower operating voltages than a conventional planar SOI FET.

Charge carriers, e.g., holes, are stored in body 217. As body 217 is a fin structure, it is better isolated from source/drain regions 235, 230 as compared to a planar device. Therefore, charge can be stored longer in body 217 improving data retention characteristics of DRAM cell 200.

FIG. 4 is a cross sectional view of FinFET 201 along the X direction at a point over body 217. As shown in FIG. 4, gate oxide layer 225 has a thickness, $T_1$, on a top surface of body 217 and a thickness, $T_2$, on sidewalls of body 217. In the illustrated embodiment, $T_1$ is greater than $T_2$. Using a thinner oxide on the sidewalls of body 217 increases band-to-band tunneling. The increased band-to-band tunneling increases carrier generation in the channel during a write "1" operation. Further, band-to-band tunneling typically does not lead to long-term device reliability degradation, as can happen where impact ionization and CHISEL are primarily used for carrier generation. Therefore, enhancing carrier generation through band-to-band tunneling can improve device reliability.

Also, as shown in FIG. 4, body 217 has a height H. As DRAM cell 200 is scaled down in size, the body height H can be increased to maintain the charge capacity of body 217.

Figure 5:
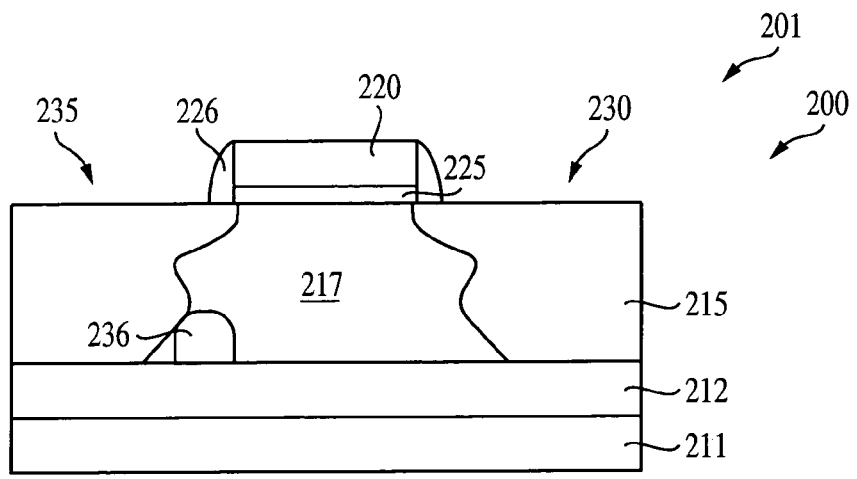
FIG. 5 is a schematic diagram of a portion of a memory cell array according to an exemplary embodiment of the invention.

FIG. 5 is a cross sectional view of FinFET 201 along the Y direction at a point over gate structure 220. FIG. 5 shows sidewall spacers 226 on sidewalls of gate structure 220. Also, FIG. 5 depicts source/drain regions 235, 230, which are heavily doped N-type regions. To achieve a PD device, a portion of body 217 is doped to a P-type conductivity, while other portions of body 217 are undoped. In the embodiment of FIG. 5, the side of body 217 adjacent to source/drain region 235 includes a P-type region 236, while the side adjacent to source/drain region 230 is undoped.

Illustratively, region 236 is a heavily doped P-type halo region. Halo region 236 is located below a point where source/drain region 235 and gate structure 220 overlap and is in contact with a bottom portion of source/drain region 235 and a top surface of BOX 212. Halo region 236 ensures that FinFET 201 is a PD device and also increases carriers generated by CHISEL mechanisms, thereby increasing programming efficiency. Leaving a side of body 217, which is adjacent to where bit line 296 is connected, undoped provides a large programming window and allows full depletion of body 217 on that side enhancing write "0" operations.

For illustration purposes, an exemplary fabrication of a single DRAM cell 200 is now described with reference to FIGS. 6A through 6H. FIGS. 6A-6D are cross sectional views of memory cell 200 along the X direction at a point over body 217. FIGS. 6E-6H are cross sectional views of memory cell 200 along the Y direction at a point over gate structure 220. The fabrication of all memory cells in memory array 299 can proceed simultaneously in a similar fashion. No particular order is required for any of the actions described herein, except for those logically requiring the results of prior actions. Accordingly, while the actions below are described as being performed in a general order, the order is exemplary only and may be altered.

Figure 6A:
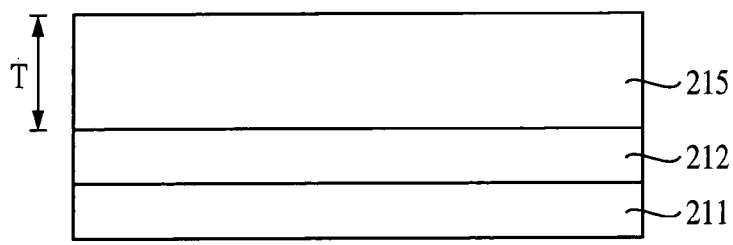
FIG. 6A is a cross sectional view of the memory cell of FIG. 2 along the X direction at an initial stage of processing.

FIG. 6A illustrates DRAM cell 200 at an initial stage of fabrication. The fabrication of DRAM cell 200 begins with an undoped SOI material comprised of three layers 211, 212, 215. The SOI material can be fabricated by methods known in the art, such as a separation by implanted oxygen process or layer transfer technique. Illustratively, the thickness T of the silicon layer 215 on the buried oxide layer 212 is greater than approximately 2000 Angstroms (Å). There is also a silicon base layer 211 underlying the buried oxide layer 212. Base layer 211 and silicon substrate layer 215 can be layers of monocrystalline silicon.

Isolation regions 213 (FIG. 3) are formed within the substrate layer 215 and filled with a dielectric material, which can be an oxide material, for example a silicon oxide, such as SiO or $SiO_2$; oxynitride; a nitride material, such as silicon nitride; silicon carbide; a high temperature polymer; or other suitable dielectric material. As noted above, illustratively, isolation regions 213 are STI regions and the dielectric material is a high density plasma (HDP) oxide, a material which has a high ability to effectively fill narrow trenches.

Figure 6B:
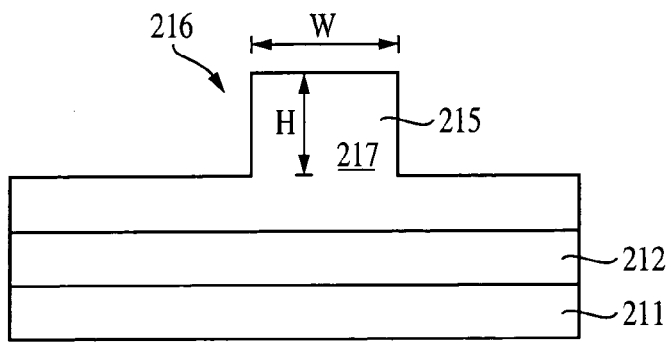
FIG. 6B is a cross sectional view of the memory cell of FIG. 2 along the X direction at an intermediate stage of processing.

As shown in FIG. 6B, a silicon wall structure 216 is etched in substrate layer 215, which forms the "fin" portion of the FinFET. Fin structure 216 can have a width W of between approximately 300 Å to approximately 1000 Å, and a height of between approximately 500 Å to approximately 4000 Å. Illustratively, the fin width W is approximately 700 Å and the fin height H is approximately 2000 Å. As noted above, the fin height H can increase as the fin width W decreases. In this example, DRAM cell 200 includes only one fin structure 216. A FinFET for DRAM cell 200, however, can be formed having more than one fin structure 216. Fin structure 216 also forms body 217 of FinFET 201. Fin structure 216 can be formed by conventional methods, such as optical lithography or spacer defined lithography.

Figure 6C:
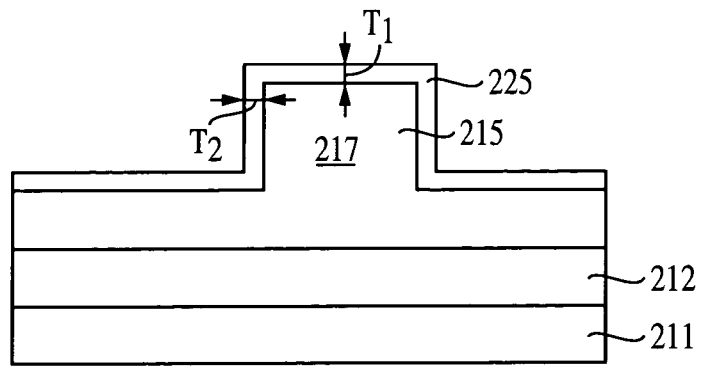
FIG. 6C is a cross sectional view of the memory cell of FIG. 2 along the X direction at an intermediate stage of processing.

An insulating layer 225 is grown or deposited by conventional methods on substrate layer 215, as shown in FIG. 6C. Insulating layer 225 can be silicon dioxide ($SiO_2$), oxynitride (ON), or a high dielectric constant (high-k) material. For purposes of this description, a high-k material is a material having a dielectric constant greater than that of $SiO_2$. Also, the term dielectric constant as used herein, refers to the intrinsic property of a particular bulk material, rather than the effective dielectric constant of a material as it is practically employed, which may be affected by material thickness or other factors. Examples of such high-k materials include, but are not limited to hafnium oxide, nitrided hafnium oxide (HfON), aluminum-doped hafnium oxide (HfAlO), aluminum oxide ($Al_2O_3$), zirconium oxide ($ZrO_2$), tantalum pentoxide ($Ta_2O_5$), lanthanum oxide ($La_2O_3$), titanium oxide ($TiO_2$), and yttrium oxide ($Y_2O_3$). Layer 225 can have a thickness from approximately 10 Å to approximately 100 Å. As noted above, the thickness $T_1$ of oxide layer 225 on a top surface of body 217 is greater than the thickness $T_2$ of the oxide layer 225 on sidewalls of body 217. Illustratively, thickness $T_1$ is approximately 50 Å and thickness $T_2$ is approximately 40 Å.

Figure 6D:
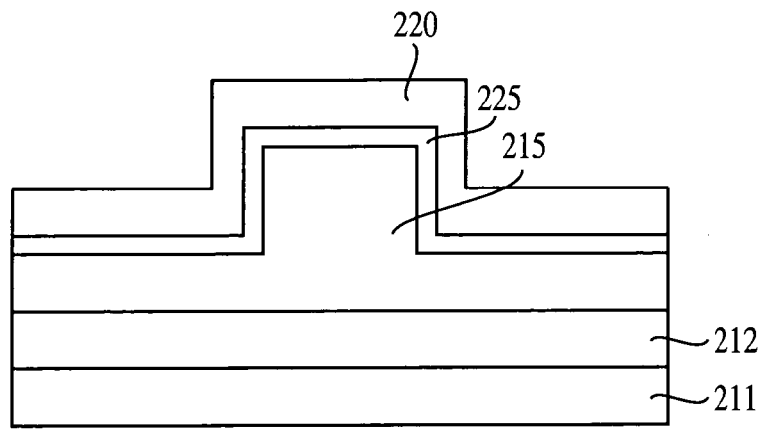
FIG. 6D is a cross sectional view of the memory cell of FIG. 2 along the X direction at an intermediate stage of processing.

As shown in FIG. 6D, a layer of conductive material 220 is deposited over the oxide layer 225. Conductive layer 220 will serve as the gate structure for the subsequently formed FinFET. Conductive layer 220 can be a layer of polysilicon or $Si_xGe_{1-x}$, which can be heavily doped to, e.g., N-type or P-type. Also, conductive layer 220 can be a metal gate formed of, for example, Ti, TaN, WN, or W, among others. The work-function of conductive layer 220 can be engineered as desired be selecting appropriate materials. Conductive layer 220 can be formed by conventional deposition methods, such as chemical vapor deposition (CVD) or plasma chemical vapor deposition (PECVD), among others. The layers 225 and 220 can be patterned and etched to form the FinFET 201 gate structure.

Figure 6E:
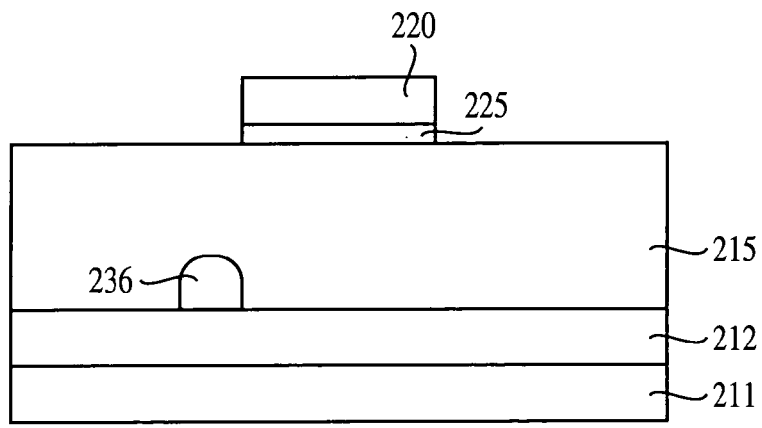
FIG. 6E is a cross sectional view of the memory cell of FIG. 2 along the Y direction at an intermediate stage of processing.
Figure 6F:
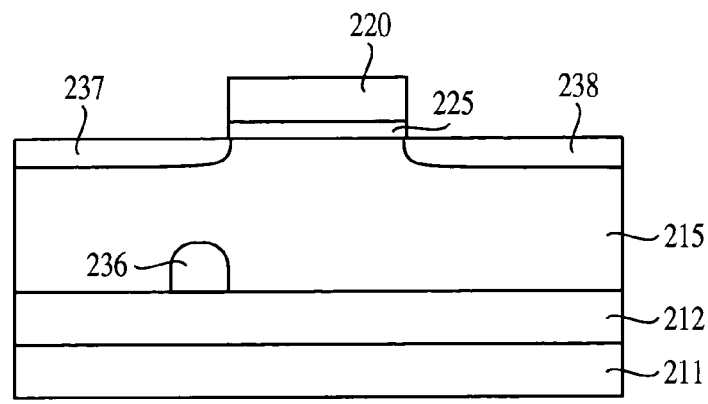
FIG. 6F is a cross sectional view of the memory cell of FIG. 2 along the Y direction at an intermediate stage of processing.
Figure 6G:
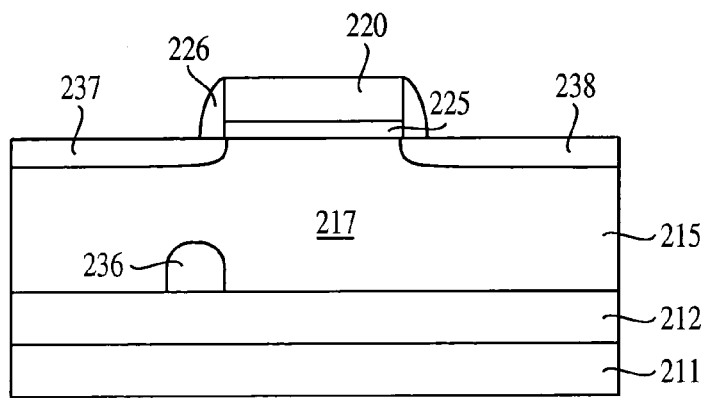
FIG. 6G is a cross sectional view of the memory cell of FIG. 2 along the Y direction at an intermediate stage of processing.

FIGS. 6E-6G are cross sectional views similar to that shown in FIG. 4 and depict further fabrication steps. As shown in FIG. 6E, a halo implant is conducted on a side of gate structure 220 adjacent to source/drain region 235 where line 294 will be connected to form a heavily doped halo region 236. For this, gate structure 220 and the opposing side of substrate layer 215 are masked (not shown) and dopants are implanted into the substrate layer 215 below and approximately aligned with an edge of gate structure 220. In this example, halo region is formed in contact with a top surface of buried oxide layer (BOX) 212.

A P-type dopant, such as boron or indium is implanted in substrate layer 215. The implant dose can be between approximately 5e12 atoms/$cm^2$ to approximately 1e14 atoms/$cm^2$. In this example the implant dose is approximately 1e13 atoms/$cm^2$. Multiple implants can be used to tailor the profile of the halo region 236. Also, angled implantation can be conducted to form halo region 236, such that implantation is carried out at angles other than 90 degrees relative to the top surface of substrate layer 215.

As shown in FIG. 6F, lightly doped source/drain (LDD) implants are performed by known techniques to provide LDD regions 237 and 238. Each LDD region 237, 238 is approximately aligned with an edge of gate structure 220. LDD regions 237, 238 are N-type regions, the same conductivity type as subsequently formed source/drain regions 235, 230.

Alternatively, LDD regions 237 and 238 can be formed separately using separate mask levels. For example, the mask used forming halo region 236 can remain when LDD region 237 is formed.

FIG. 6G depicts the formation of sidewall spacers 226 on sidewalls of gate structure 220. Illustratively, sidewall spacers 226 are oxide spacers, but could instead be any appropriate dielectric material, such as silicon dioxide, silicon nitride, an oxynitride, oxide/nitride (ON), nitride/oxide (NO), oxide/nitride/oxide (ONO), or Tetraethyl Orthosilicate (TEOS), among others, formed by methods known in the art.

Figure 6H:
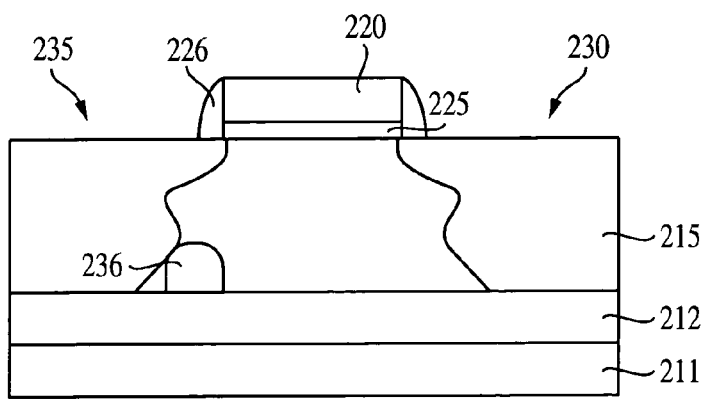
FIG. 6H is a cross sectional view of the memory cell of FIG. 2 along the Y direction at an intermediate stage of processing.

Source/drain regions 235, 230 can be implanted by known methods to achieve the structure shown in FIG. 6H. Source/drain regions 235, 230 are formed as heavily doped N-type regions within substrate layer 215. Source/drain regions 235, 230 are formed contacting BOX 212 and are approximately aligned with edges of sidewall spacers 226. N-type dopants such as phosphorus, arsenic, or antimony can be used.

Conventional processing methods can be used to complete DRAM cell 200. For example, insulating and metallization layers to connect a bit line, word line, and source line to cell 200 may be formed. The entire surface can be covered with a passivation layer (not shown) of, for example, silicon dioxide, borosilicate glass (BSG), phosphosilicate glass (PSG), or borophosphosilicate glass (BPSG), which is CMP planarized and etched to provide contact holes, which are then metallized to provide contacts. Conventional layers of conductors and insulators can also be used to connect cell 200 to peripheral circuitry.

FIGS. 7-10 are cross sectional views of cell 200 according to additional exemplary embodiments of the invention. Each of the embodiments illustrated in FIGS. 7-10 can be generally formed as described above in connection with FIGS. 6A-6H with differences noted below.

Figure 7:
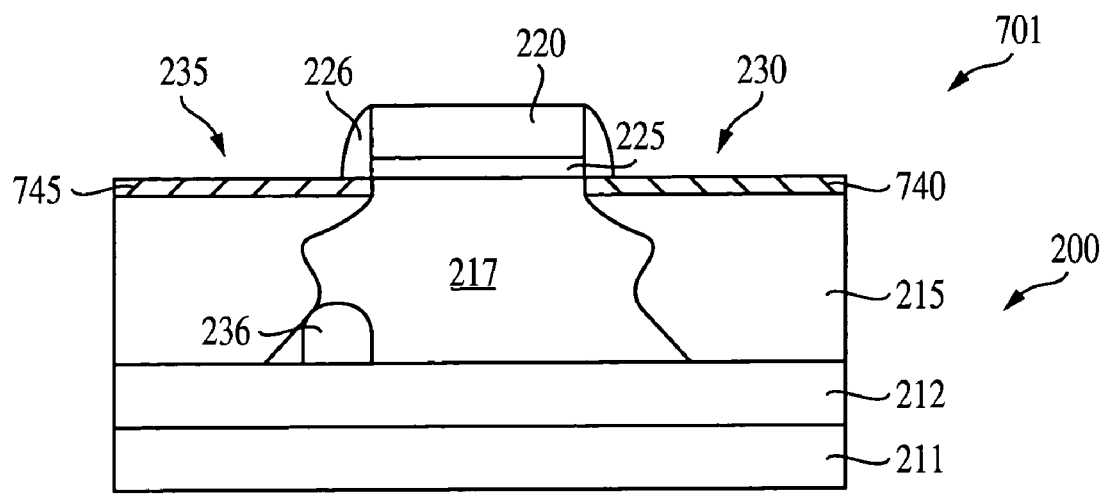
FIG. 7 is a cross sectional view of a memory cell according to another exemplary embodiment of the invention.

As shown in FIG. 7, DRAM cell 200 can include FinFET 701 having a silicide layer 745 in contact with a surface of substrate layer 215 over source/drain region 235 and a silicide layer 740 in contact with a surface of substrate layer 215 over source/drain region 230. Silicide layers 745, 740 can have a thickness between approximately 50 Å and approximately 500 Å. In the example of FIG. 7, silicide layers 745, 740 are approximately 150 Å thick. Silicide layers 745, 740 can be, for example, cobalt silicide, tantalum silicide, nickel silicide, platinum silicide, or silver silicide.

Silicide layer 245 is a different silicide than silicide layer 240. Silicide layers 745, 740 can be formed by methods known in the art, such as deposition of a metal layer followed by an annealing step. Layers 745, 740 are formed such that the Schottky barrier height between one of source/drain regions 235, 230 and body 217 is higher than between the other of source/drain regions 235, 230 and body 217. Schottky barrier height depends on the work-function of the silicide. A higher work-function tends to result in a higher Schottky barrier.

In the embodiment of FIG. 7, the Schottky barrier height is higher on the source/drain region 235 side adjacent to where line 294 (FIG. 2) is to be connected. Alternatively, drain silicide layer 740 can be omitted and there can be a silicide layer 745 over only source/drain region 235.

Also, an increased dopant level augments the Schottky barrier. Accordingly, the dopant level in the source/drain region 235 can be greater than that in the source/drain region 230. In such a case, source/drain regions 235, 230 can be formed in separate steps.

Providing a higher Schottky barrier on the side of FinFET 701 adjacent to line 504 serves to increase carrier generation in the body 217 due to gate tunneling effect when FinFET 201 is in an on-state. Gate tunneling causes a tunneling current from the gate to the body increasing the body charge. Additionally, such a Schottky barrier increases high-energy carriers, thereby increasing the probability of impact ionization.

Figure 8:
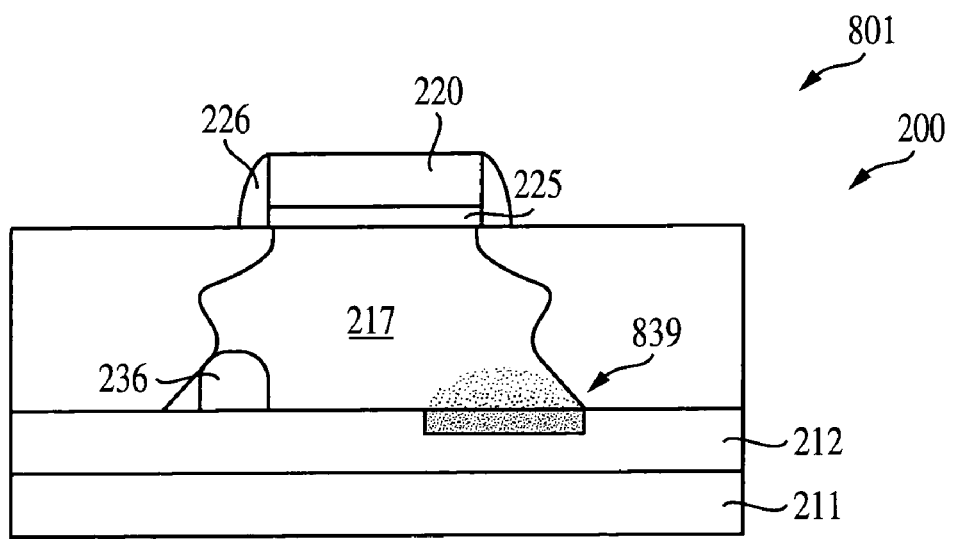
FIG. 8 is a cross sectional view of a memory cell according to another exemplary embodiment of the invention.

Referring to FIG. 8, DRAM cell 200 can include a FinFET 801 having an inert dopant region 839. Inert dopant region 839 is below an edge of gate structure 220 on the side of body 217 opposite to halo region 236 and adjacent to source/drain region 230. Region 839 has an amorphous dopant profile. Illustratively, the peak of the dopant profile lies within buried oxide layer (BOX) 212. Region 839 is formed by implanting inert ions such as argon, germanium, silicon, or other appropriate material. The implant dose used to form region 839 is within the range of approximately 5e12 atoms/$cm^2$ to approximately 1e16 atoms/$cm^2$, and is desirably approximately 1e15 atoms/$cm^2$. Region 839 can be implanted according to the methods described in U.S. Pat. No. 6,503,783, by the present inventor, which is incorporated herein by reference in its entirety.

Inert dopant region 839 enhances a write "0" operation by providing recombination centers in BOX 212 on the side of FinFET 801 adjacent to bit line 206 (FIG. 2). This also serves to increase the programming window for DRAM cell 200.

Figure 9A:
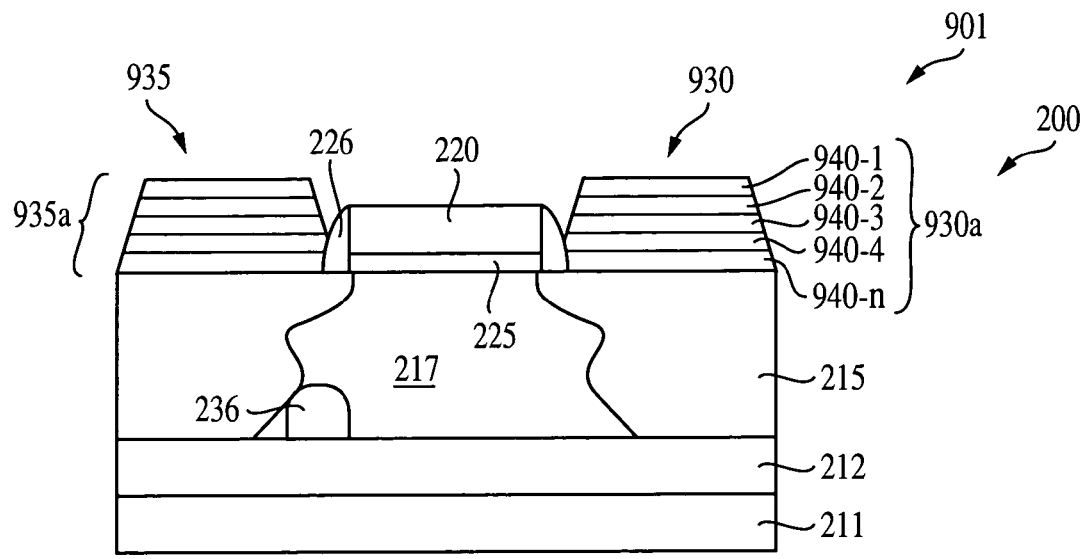
FIG. 9A is a cross sectional view of a memory cell according to another exemplary embodiment of the invention.

FIG. 9A depicts FinFET 901, which can be included in DRAM cell 200. FinFET 901 has source/drain regions 235, 230, which are raised (elevated) such that raised portions 935a, 930a share a same horizontal spatial plane as gates 220a and 220b on sidewalls of body 217. The raised portions 935a, 930a are an epitaxial layer grown over substrate layer 215 by known methods. Illustratively, raised portions 935a, 930a include multiple layers. Portions 935a, 930a can have any number of layers, which can be formed of two or more different materials having different band gaps. Illustratively, portions 935a, 930a include layers 904-1 through 940-n, which are alternating layers of $Si_xGe_{1-x}$ and $Si_yGe_{1-y}$, where x does not equal y.

Figure 9B:
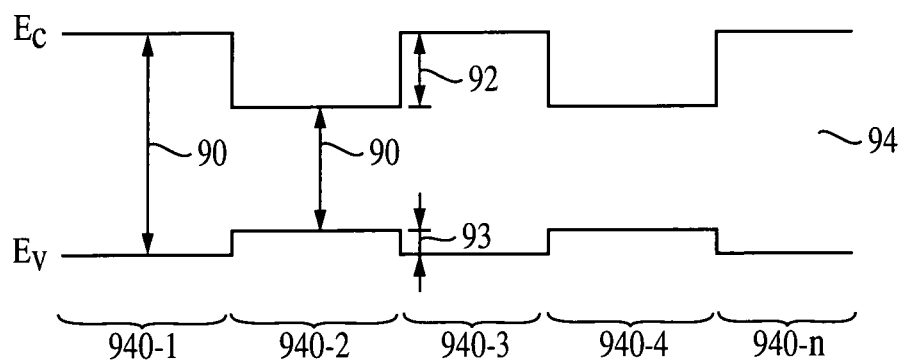
FIG. 9B is an energy band diagram for a portion of the memory cell of FIG. 9A.

FIG. 9B is an energy band diagram illustrating the band energies of layers 940-1 through 940-n of raised portions 935a, 930a. "Ec" represents the energy level of the conduction band and "Ev" represents the energy level of the valence band. Between Ec and Ev is the forbidden gap 94, where carriers (electrons or holes) ideally do not have any allowed energy state.

As shown in FIG. 9B, each individual layer has a different bad gap than an adjacent layer. Illustratively, layers 940-1, 940-3, and 940-n are formed of a first material, $Si_xGe_{1-x}$, and layers 940-2 and 940-4 are formed of a second material, $Si_yGe_{1-y}$. In the example of FIG. 9B, the first material has a greater band gap than the second material. Accordingly, there is a greater difference in Ec and Ev, represented by reference numeral 90, for the first material layers 940-1, 940-3, and 940-n than for the second material layers 940-2 and 940-4, represented by reference numeral 91. The difference between the levels of Ec for the first and second materials is illustrated by reference numeral 92.

Carriers are accelerated through the layers in the presence of an electric field and gain energy. In the example of FIGS. 9A and 9B, electrons gain energy because of the difference between the levels of Ec 92 for the materials. Thereby, carrier injection velocity in source/drain region 935 is increased improving the probability for impact ionization.

Illustratively, the difference between the levels of Ev for the first and second materials, represented by reference numeral 93, is less than the difference between the levels of Ec for the first and second materials 92. Accordingly, holes gain less energy than electrons. Where FinFET 901 is a P-channel device, source/drain regions 235, 230 can be configured such that hole injection velocity in the source/drain region 235 is increased. In such a case, the difference of Ec between the first and second materials can be greater.

Figure 10:
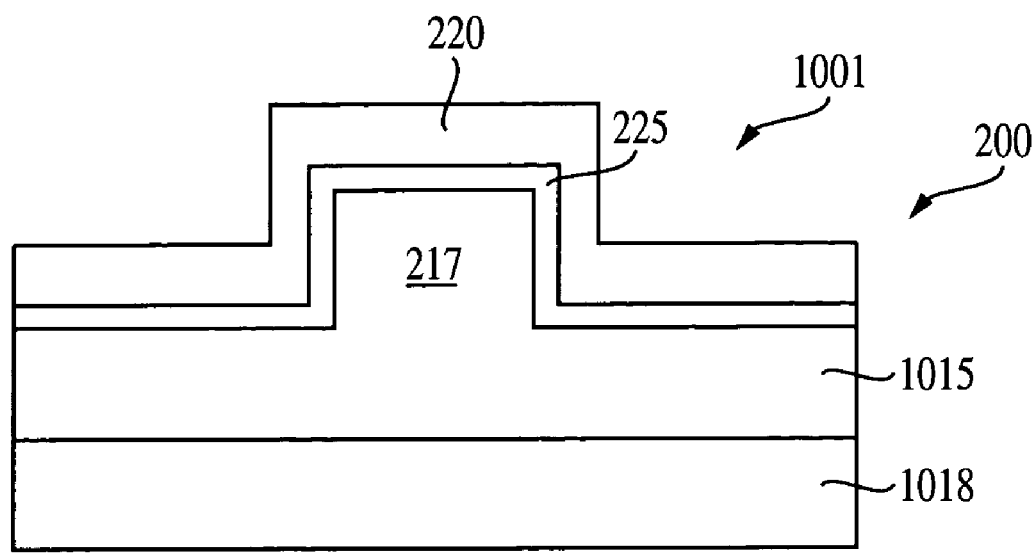
FIG. 10 is a cross sectional view of a memory cell according to another exemplary embodiment of the invention.

FIG. 10 illustrates FinFET 1001, which can be included in DRAM cell 200. FinFET 1001 can have the same structure as any of the FinFET's described above in connection with FIGS. 2-9 except that FinFET 1001 is not formed on a SOI substrate. Instead, FinFET 1001 is formed on a semiconductor substrate 1015. Accordingly, FinFET 1001 is not over a buried oxide layer.

Instead, memory cell 200 includes a heavily doped N-tub layer 1018 underlying a P-type substrate 1015. N-tub layer 1018 creates a barrier for minority carriers. N-tub layer 1018 can be formed by techniques known in the art prior to forming devices of memory cell 200, such as FinFET 1001. Although FinFET 1001 does not provide the benefits of an SOI substrate, it is a cost effective alternative.

The additional features described above in connection with FIGS. 7-10 need not be employed in isolation. Thus, according to further exemplary embodiments of the invention, features described above in connection with FIGS. 7-10 can be combined in a single DRAM cell 200. For example, and without being limiting, DRAM cell 200 can include a FinFET having and inert dopant region and raised source and drain regions.

Although a DRAM cell 200 of the above embodiments is described as including a FinFET, the invention is not limited to a storage transistor with a body having a fin structure. The invention can include any transistor device having a wrapped-around gate structure. That is, a DRAM cell 200 can include a storage transistor that includes a gate structure that wraps at least partially around the body portion of the transistor in at least two spatial planes. For example, DRAM cell 200 can include a cylindrical or surround gate that wraps around sidewalls of a pillar-shaped body or an omega FET, among others.

Although the above embodiments are described with respect to an N-channel device, the invention is also applicable to a DRAM cell 200 that includes a P-channel device. Where DRAM cell 200 includes a P-channel device, the conductivity types of the structures would change, as is known in the art. For example, source and drain regions would be P-type regions.

Figure 11:
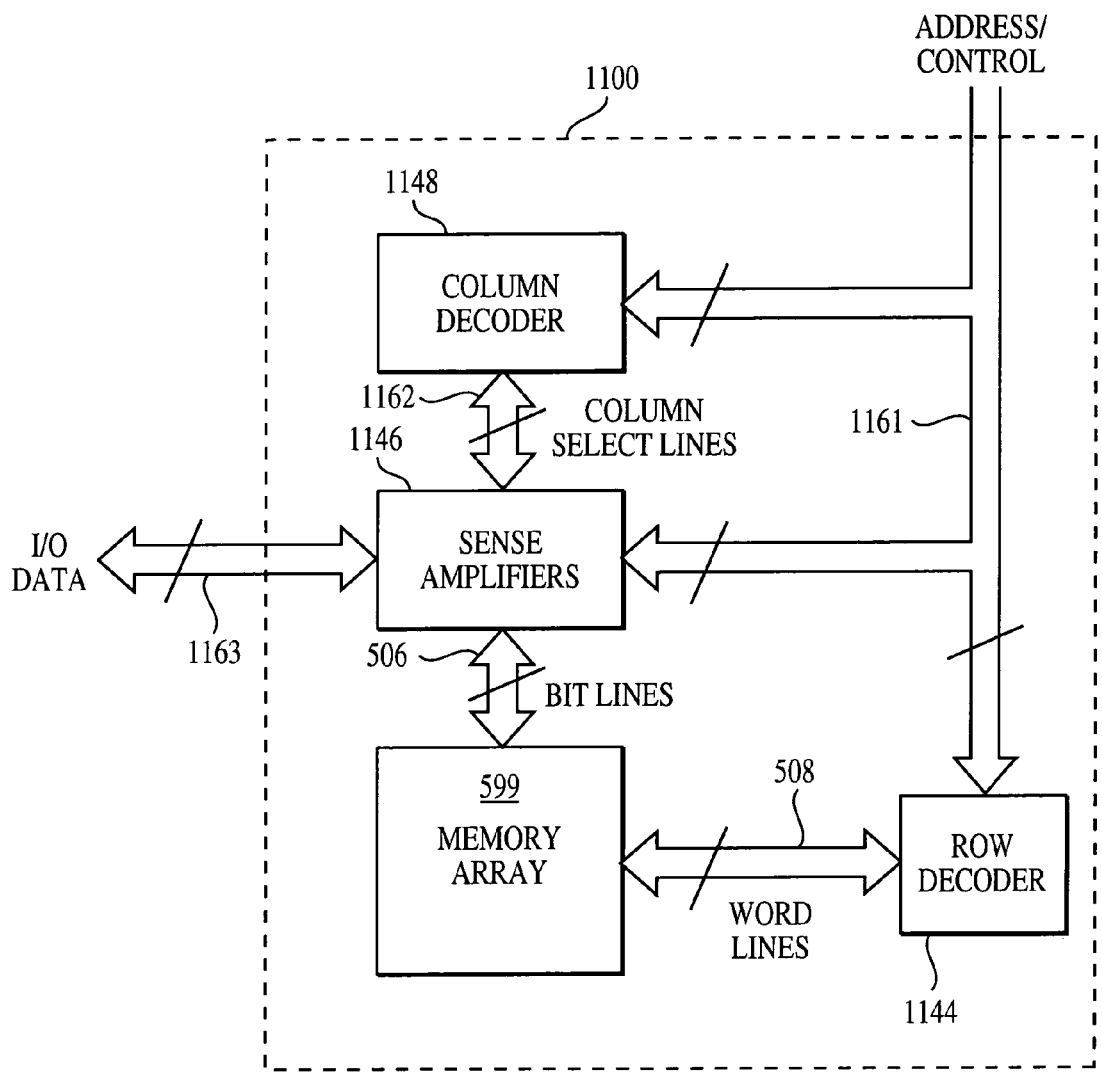
FIG. 11 is a block diagram of a memory device according to an exemplary embodiment of the invention.

FIG. 11 illustrates a DRAM circuit 1100. DRAM circuit 1100 contains a memory array 299, row and column decoders 1144, 1148 and a sense amplifier circuit 1146. The memory array 299 consists of a plurality of memory cells 200, which are formed as described above in connection with FIGS. 2-10. Circuitry peripheral to memory array 299 can be formed at a surface of an SOI substrate. Word lines 298 and bit lines 296 are arranged into rows and columns, respectively. The bit lines 296 of the memory array 299 are connected to the sense amplifier circuit 1146, while word lines 298 are connected to the row decoder 1144. Address and control signals are input on address/control lines 1161 into the DRAM circuit 1100 and connected to the column decoder 1148, sense amplifier circuit 1146 and row decoder 1144. The address and control signals are used for read and write access, among other things, to the memory array 299.

The column decoder 1148 is connected to the sense amplifier circuit 1146 via control and column select signals on column select lines 1162. The sense amplifier circuit 1146 receives input data destined for the memory array 299 and outputs data read from the memory array 299 over input/output (I/O) data lines 1163. Data is read from the cells of the memory array 1142 by activating a word line 298 (via the row decoder 1144), which couples all of the memory cells corresponding to that word line to respective bit lines 296, which define the columns of the array. One or more bit lines 296 are also activated. When a particular word line 508 and bit lines 296 are activated, the sense amplifier circuit 1146 connected to a bit line column detects and amplifies the data bit transferred from the memory cell to its bit line 296.

Figure 12:
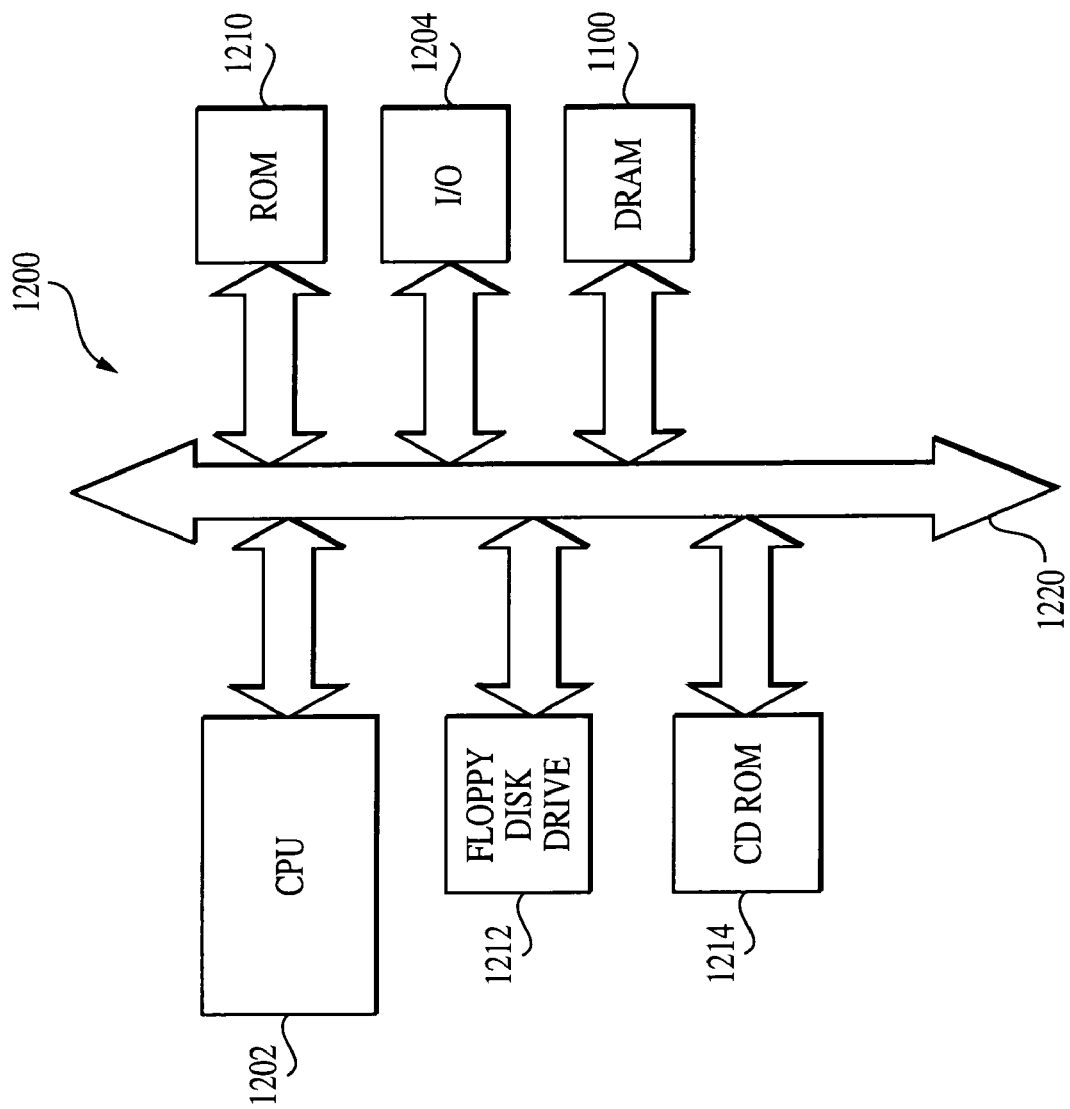
FIG. 12 is a schematic diagram of a processor system including the memory device of FIG. 11.

FIG. 12 illustrates a block diagram of a processor system 1200 containing a DRAM circuit 1100 of FIG. 11. The processor system 1200 may be a computer system or any other processor system. The system 1200 includes a central processing unit (CPU) 1202, e.g., a microprocessor, that communicates with floppy disk drive 1212, CD ROM drive 1214, and DRAM circuit 1100 over a bus 1220. It must be noted that the bus 1220 may be a series of buses and bridges commonly used in a processor-based system, but for convenience purposes only, the bus 1220 has been illustrated as a single bus.

An input/output (I/O) device (e.g., monitor) 1204 may also be connected to the bus 1220, but is not required in order to practice the invention. The processor-based system 1200 also includes a read-only memory (ROM) 1210 which may also be used to store a software program.

Although the FIG. 12 block diagram depicts only one CPU 1202, the FIG. 12 system could also be configured as a parallel processor machine for performing parallel processing. As known in the art, parallel processor machines can be classified as single instruction/multiple data (SIMD), meaning all processors execute the same instructions at the same time, or multiple instruction/multiple data (MIMD), meaning each processor executes different instructions.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention. Accordingly, the invention is not limited by the foregoing description or drawings, but is only limited by the scope of the appended claims.

What is claimed as new and desired to be protected by Letters Patent of the United States is:

1. A method of forming a memory device, the method comprising:
    forming a partially depleted storage transistor at a surface of a substrate, the act of forming the partially depleted storage transistor comprising:
    forming a body portion protruding from a surface of the substrate,
    forming a first source/drain region of a first conductivity type on a side of the body portion,
    forming a second source/drain region of the first conductivity type on an opposing side of the body portion from the first source/drain region, and
    forming a gate structure wrapping at least partially around the body portion in at least two spatial planes;
    forming a bit line connected to the first source/drain region; and
    forming a word line connected to the gate structure,
    wherein the act of forming the storage transistor comprises forming a FinFet.

2. The method of claim 1, wherein the act of forming the storage transistor comprises forming the storage transistor at a surface of a semiconductor layer of a second conductivity type and overlying a semiconductor layer of a first conductivity type.

3. The method of claim 1, wherein the act of forming the gate structure comprises forming a gate electrode of a material from the group consisting of P+ polysilicon, N+ polysilicon, P+ $Si_xGe_{1-x}$, N+ $Si_xGe_{1-x}$, Ti, TaN, WN, and W.

4. The method of claim 1, wherein the act of forming the gate structure comprises forming a metal gate electrode.

5. The method of claim 1, wherein the act of forming the storage transistor further comprises forming an insulating layer between the gate structure and the body portion, and wherein the thickness of the insulating layer on a top surface of the body portion is greater than the thickness of the insulating layer on a sidewall of the body portion.

6. The method of claim 5, wherein the act of forming the insulating layer comprises forming a layer of a material from the group consisting of silicon oxide, oxynitride, nitrided hafnium oxide, aluminum-doped hafnium oxide, hafnium oxide, aluminum oxide, zirconium oxide, tantalum pentoxide lanthanum oxide, titanium oxide, and yttrium oxide.

7. The method of claim 5, wherein the act of forming the insulating layer comprises forming a layer of a material having a high dielectric constant.

8. A method of forming a memory device, the method comprising:
    forming a partially depleted storage transistor at a surface of a substrate,
    the act of forming the partially depleted storage transistor comprising:
    forming a body portion protruding from a surface of the substrate,
    forming a first source/drain region of a first conductivity type on a side of the body portion,
    forming a second source/drain region of the first conductivity type on an opposing side of the body portion from the first source/drain region, and
    forming a gate structure wrapping at least partially around the body portion in at least two spatial planes;
    forming a bit line connected to the first source/drain region; and
    forming a word line connected to the gate structure,
    wherein the act of forming the storage transistor comprises forming the storage transistor at a surface of a silicon-on-insulator substrate.

9. A method of forming a memory device, the method comprising:
    forming a partially depleted storage transistor at a surface of a substrate,
    the act of forming the partially depleted storage transistor comprising:
    forming a body portion protruding from a surface of the substrate,
    forming a first source/drain region of a first conductivity type on a side of the body portion,
    forming a second source/drain region of the first conductivity type on an opposing side of the body portion from the first source/drain region, and
    forming a gate structure wrapping at least partially around the body portion in at least two spatial planes;
    forming a bit line connected to the first source/drain region; and
    forming a word line connected to the gate structure,
    wherein the act of forming the storage transistor further comprises forming a heavily doped region of a second conductivity type adjacent to the second source/drain region and separated from the first source/drain region.

10. A method of forming a memory device, the method comprising:
    forming a partially depleted storage transistor at a surface of a substrate,
    the act of forming the partially depleted storage transistor comprising:
    forming a body portion protruding from a surface of the substrate,
    forming a first source/drain region of a first conductivity type on a side of the body portion,
    forming a second source/drain region of the first conductivity type on an opposing side of the body portion from the first source/drain region, and
    forming a gate structure wrapping at least partially around the body portion in at least two spatial planes;
    forming a bit line connected to the first source/drain region; and
    forming a word line connected to the gate structure,
    wherein the act of forming the storage transistor further comprises forming an inert dopant region heavily doped with inert ions adjacent to the first source/drain region and separated from the second source/drain region.

11. The method of claim 10, wherein the act of forming the inert dopant region comprises implanting a dose within the range of approximately 5e12 atoms/cm$^2$ to approximately 1e16 atoms/cm$^2$.

12. A method of forming a memory device, the method comprising:
    forming a partially depleted storage transistor at a surface of a substrate,
    the act of forming the partially depleted storage transistor comprising:
    forming a body portion protruding from a surface of the substrate,
    forming a first source/drain region of a first conductivity type on a side of the body portion,
    forming a second source/drain region of the first conductivity type on an opposing side of the body portion from the first source/drain region, and
    forming a gate structure wrapping at least partially around the body portion in at least two spatial planes;
    forming a bit line connected to the first source/drain region; and
    forming a word line connected to the gate structure,
    wherein the act of forming the storage transistor further comprises forming a higher Schottky barrier between the second source/drain region and the body portion than a Schottky barrier between the body portion and the first source/drain region.

13. The method of claim 12, wherein the act of forming the storage transistor further comprises forming a silicide layer in contact with the second source/drain region.

14. The method of claim 13, wherein the act of forming the storage transistor further comprises forming a silicide layer in contact with the first source/drain region.

15. A method of forming a memory device, the method comprising:
    forming a partially depleted storage transistor at a surface of a substrate,
    the act of forming the partially depleted storage transistor comprising:
    forming a body portion protruding from a surface of the substrate,
    forming a first source/drain region of a first conductivity type on a side of the body portion,
    forming a second source/drain region of the first conductivity type on an opposing side of the body portion from the first source/drain region, and
    forming a gate structure wrapping at least partially around the body portion in at least two spatial planes;
    forming a bit line connected to the first source/drain region; and
    forming a word line connected to the gate structure,
    wherein the acts of forming the first and second source/drain regions comprise growing at least one epitaxial layer such that the first and second source/drain regions share a same horizontal spatial plane as the portion of the gate structure on a sidewall of the body portion.

16. A method of forming a memory device, the method comprising:
    forming a partially depleted storage transistor at a surface of a substrate,
    the act of forming the partially depleted storage transistor comprising:
    forming a body portion protruding from a surface of the substrate,
    forming a first source/drain region of a first conductivity type on a side of the body portion,
    forming a second source/drain region of the first conductivity type on an opposing side of the body portion from the first source/drain region, and
    forming a gate structure wrapping at least partially around the body portion in at least two spatial planes;
    forming a bit line connected to the first source/drain region; and
    forming a word line connected to the gate structure,
    wherein the acts of forming each of the first and second source/drain regions comprise forming a plurality of layers, the act of forming the plurality of layers comprising forming at least one layer of a first material and at least one layer of a second material.

17. The memory device of claim 16, wherein the first and second materials have different valence band energies.

18. The method of claim 16, wherein the act of forming the plurality of layers comprises forming a plurality of layers having different band gaps.

19. The method of claim 16, wherein the act of forming the plurality of layers comprises configuring the plurality of such that a first carrier type gains energy upon moving through the plurality of layers.

20. The method of claim 16, wherein the act of forming the plurality of layers comprises forming alternating layers of $Si_xGe_{1-x}$ and $Si_yGe_{1-y}$, where x is not equal to y.

21. A method of fabricating a partially depleted storage transistor, the method comprising:
    forming at least one fin-shaped structure protruding from a surface of the substrate, the at least one fin-shaped structure forming at least a portion of a channel region of the partially depleted storage transistor;
    forming a first source/drain region of a first conductivity type on a side of the at least one fin-shaped structure;
    forming a second source/drain region of a first conductivity type on a side of the at least one fin-shaped structure opposite to the first source/drain region;
    forming a region of a second conductivity type in the substrate adjacent to the second source/drain region and separated from the first source/drain region; and
    forming a gate structure, wherein the gate structure wraps at least partially around the at least one fin-shaped structure in at least two spatial planes,
    wherein the act of forming the at least one fin-shaped structure comprises forming the at least one structure protruding from a surface of a silicon-on-insulator substrate.

22. The method of claim 21, wherein the act of forming the at least one fin-shaped structure comprises etching a surface of the substrate.

23. The method of claim 21, wherein the act of forming the at least one fin-shaped structure comprises forming the at least one fin-shaped structure protruding from a surface of a semiconductor layer of a second conductivity type and overlying a semiconductor layer of a first conductivity type.

24. The method of claim 21, wherein the act of forming the gate structure comprises forming a gate electrode of a material from the group consisting of P+ polysilicon, N+ polysilicon, P+ $Si_xGe_{1-x}$, N+ $Si_xGe_{1-x}$, Ti, TaN, WN, and W.

25. The method of claim 21, wherein the act of forming the gate structure comprises forming a metal gate electrode.

26. The method of claim 21, further comprising forming an insulating layer between the gate structure and the at least one fin-shaped structure, and wherein the thickness of the insulating layer on a top surface of the at least one fin-shaped structure is greater than the thickness of the insulating layer on a sidewall of the at least one fin-shaped structure.

27. The method of claim 26, wherein the act of forming the insulating layer comprises forming a layer of a material from the group consisting of silicon oxide, oxynitride, nitrided hafnium oxide, aluminum-doped hafnium oxide, hafnium oxide, aluminum oxide, zirconium oxide, tantalum pentoxide lanthanum oxide, titanium oxide, and yttrium oxide.

28. The method of claim 26, wherein the act of forming the insulating layer comprises forming a layer of a material having a high dielectric constant.

29. The method of claim 28, further comprising forming a silicide layer in contact with the second source/drain region.

30. A method of fabricating a partially depleted storage transistor, the method comprising:
   forming at least one fin-shaped structure protruding from a surface of the substrate, the at least one fin-shaped structure forming at least a portion of a channel region of the partially depleted storage transistor;
   forming a first source/drain region of a first conductivity type on a side of the at least one fin-shaped structure;
   forming a second source/drain region of a first conductivity type on a side of the at least one fin-shaped structure opposite to the first source/drain region;
   forming a region of a second conductivity type in the substrate adjacent to the second source/drain region and separated from the first source/drain region;
   forming a gate structure, wherein the gate structure wraps at least partially around the at least one fin-shaped structure in at least two spatial planes; and
   forming an inert dopant region heavily doped with inert ions adjacent to the first source/drain region and separated from the second source/drain region.

31. The method of claim 30, wherein the act of forming the inert dopant region comprises implanting a dose within the range of approximately 5e12 atoms/cm$^2$ to approximately 1e16 atoms/cm$^2$.

32. A method of fabricating a partially depleted storage transistor, the method comprising:
   forming at least one fin-shaped structure protruding from a surface of the substrate, the at least one fin-shaped structure forming at least a portion of a channel region of the partially depleted storage transistor;
   forming a first source/drain region of a first conductivity type on a side of the at least one fin-shaped structure;
   forming a second source/drain region of a first conductivity type on a side of the at least one fin-shaped structure opposite to the first source/drain region;
   forming a region of a second conductivity type in the substrate adjacent to the second source/drain region and separated from the first source/drain region;
   forming a gate structure, wherein the gate structure wraps at least partially around the at least one fin-shaped structure in at least two spatial planes; and
   forming a higher Schottky barrier between the second source/drain region and the at least one fin-shaped structure than a Schottky barrier between the at least one fin-shaped structure and the first source/drain region.

33. The method of claim 32, further comprising forming a suicide layer in contact with the first source/drain region.

34. A method of fabricating a partially depleted storage transistor, the method comprising:
   forming at least one fin-shaped structure protruding from a surface of the substrate, the at least one fin-shaped structure forming at least a portion of a channel region of the partially depleted storage transistor;
   forming a first source/drain region of a first conductivity type on a side of the at least one fin-shaped structure;
   forming a second source/drain region of a first conductivity type on a side of the at least one fin-shaped structure opposite to the first source/drain region;
   forming a region of a second conductivity type in the substrate adjacent to the second source/drain region and separated from the first source/drain region; and
   forming a gate structure, wherein the gate structure wraps at least partially around the at least one fin-shaped structure in at least two spatial planes,
   wherein the acts of forming the first and second source/drain regions comprise growing at least one epitaxial layer such that the first and second source/drain regions share a same horizontal spatial plane as the portion of the gate structure on a sidewall of the at least one fin-shaped structure.

35. The memory device of claim 34, wherein the first and second materials have different valence band energies.

36. The method of claim 34, wherein the first and second materials have different band gaps.

37. The method of claim 34, wherein the act of forming the plurality of layers comprises configuring the plurality of such that a first carrier type gains energy upon moving through the plurality of layers.

38. The method of claim 34, wherein the act of forming the plurality of layers comprises forming alternating layers of $Si_xGe_{1-x}$ and $Si_yGe_{1-y}$, where x is not equal to y.

39. A method of fabricating a partially depleted storage transistor, the method comprising:
   forming at least one fin-shaped structure protruding from a surface of the substrate, the at least one fin-shaped structure forming at least a portion of a channel region of the partially depleted storage transistor;
   forming a first source/drain region of a first conductivity type on a side of the at least one fin-shaped structure;
   forming a second source/drain region of a first conductivity type on a side of the at least one fin-shaped structure opposite to the first source/drain region;
   forming a region of a second conductivity type in the substrate adjacent to the second source/drain region and separated from the first source/drain region; and
   forming a gate structure, wherein the gate structure wraps at least partially around the at least one fin-shaped structure in at least two spatial planes,
   wherein the acts of forming each of the first and second source/drain regions comprise forming a plurality of layers, the act of forming the plurality of layers comprising forming at least one layer of a first material and at least one layer of a second material.

* * * * *

UNITED STATES PATENT AND TRADEMARK OFFICE
CERTIFICATE OF CORRECTION

PATENT NO. : 7,605,028 B2 Page 1 of 1
APPLICATION NO. : 11/042207
DATED : January 26, 2005
INVENTOR(S) : Chandra Mouli It is certified that error appears in the above-identified patent and that said Letters Patent is hereby corrected as shown below:

In column 1, line 7, delete "is" and insert -- is a --, therefor.

In column 11, line 44, in Claim 1, delete "FinFet." and insert -- FinFET. --, therefor.

In column 11, line 66, in Claim 6, delete "pentoxide" and insert -- pentoxide, --, therefor.

In column 13, line 5, in Claim 11, delete "atoms/cm$^2$to" and insert -- atoms/cm$^2$ to --, therefor.

In column 14, line 16, in Claim 17, delete "memory device" and insert -- method --, therefor.

In column 15, line 7, in Claim 27, delete "pentoxide" and insert -- pentoxide, --, therefor.

In column 16, line 2, in Claim 33, delete "suicide" and insert -- silicide --, therefor.

In column 16, line 26, in Claim 35, delete "memory device" and insert -- method --, therefor.

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO.       : 7,605,028 B2                                    Page 1 of 1
APPLICATION NO. : 11/042207
DATED            : October 20, 2009
INVENTOR(S)      : Chandra Mouli It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 507 days.

Signed and Sealed this

Fifth Day of October, 2010

David J. Kappos
*Director of the United States Patent and Trademark Office*